United States Patent
Badrudduza et al.

(10) Patent No.: US 9,136,845 B2
(45) Date of Patent: Sep. 15, 2015

(54) LEVEL SHIFTER WITH IMPROVED OPERATION

(71) Applicants: Sayeed Ahmed Badrudduza, Austin, TX (US); Alexander Bernhard Hoefler, Austin, TX (US)

(72) Inventors: Sayeed Ahmed Badrudduza, Austin, TX (US); Alexander Bernhard Hoefler, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 59 days.

(21) Appl. No.: 14/180,322

(22) Filed: Feb. 13, 2014

(65) Prior Publication Data

US 2015/0229307 A1    Aug. 13, 2015

(51) Int. Cl.
  *H03L 5/00*     (2006.01)
  *H03K 19/0175*  (2006.01)
  *H03K 19/0948*  (2006.01)
  *H03K 3/037*    (2006.01)

(52) U.S. Cl.
  CPC ........ *H03K 19/017509* (2013.01); *H03K 3/037* (2013.01); *H03K 19/0948* (2013.01)

(58) Field of Classification Search
  CPC .................. H03K 19/017509; H03K 19/0185; H03K 19/018507; H03K 19/018514; H03K 19/018521; H03K 19/018528
  USPC ........................... 327/333; 326/63, 68, 80, 81
  See application file for complete search history.

(56) References Cited

U.S. PATENT DOCUMENTS

| 7,268,588 | B2  |   9/2007 | Sanchez et al. |
| 7,443,223 | B2  |  10/2008 | Bajkowski et al. |
| 7,629,830 | B1* |  12/2009 | Rubin ............................ 327/333 |
| 7,683,668 | B1  |   3/2010 | Thakur et al. |

\* cited by examiner

*Primary Examiner* — William Hernandez
(74) *Attorney, Agent, or Firm* — Atesa Legal LLC

(57) ABSTRACT

A level shifter includes a first branch and a second branch. A trigger of the first branch is coupled to a low voltage input, an inverted high voltage output and a ground. A latch of the first branch is coupled to the inverted high voltage output and a high voltage output. A power gate of the first branch is coupled to an inverted low voltage input, the latch of the first branch and a high voltage supply. A trigger of the second branch is coupled to the inverted low voltage input, the high voltage output and the ground. A latch of the second branch is coupled to the high voltage output and the inverted high voltage output. A power gate of the second branch is coupled to the low voltage input, the latch of the second branch and the high voltage supply.

20 Claims, 6 Drawing Sheets

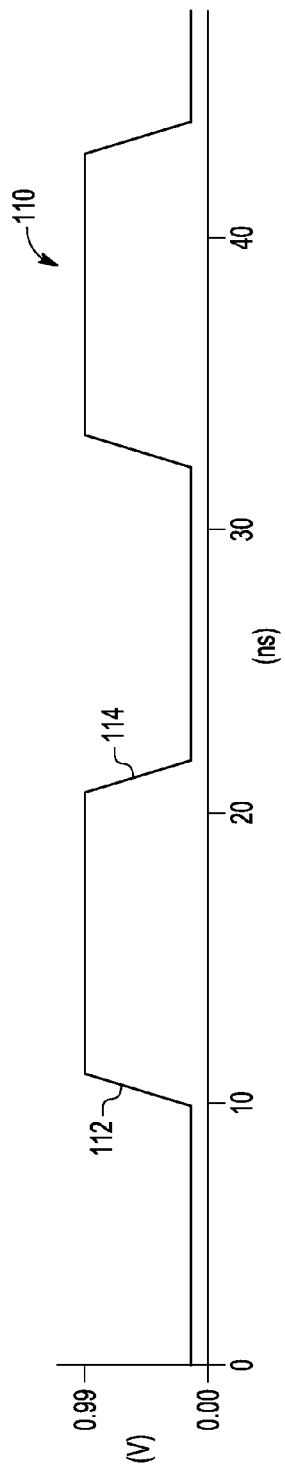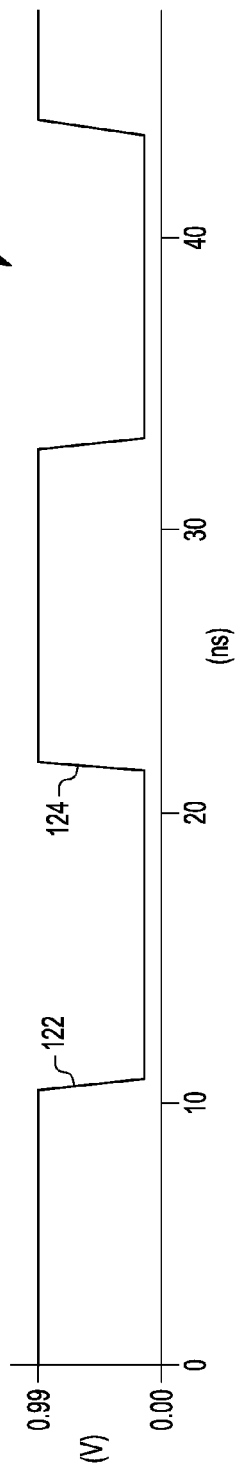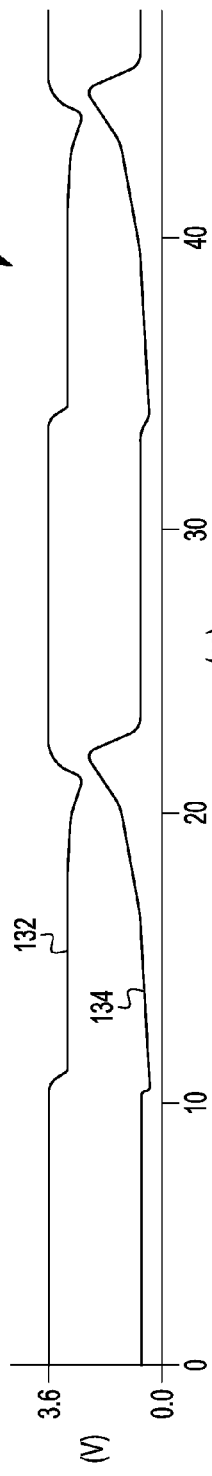

LEVEL SHIFTER WITH IMPROVED OPERATION

FIELD

This disclosure relates generally to electronic circuitry, and more specifically to electronic circuitry and methods for level shifting.

BACKGROUND

Electronic circuits frequently employ multiple voltage domains to improve various performance parameters. In one example, a low voltage domain is used for lower power operation, while a higher voltage domain is used for faster operation. Circuits that use a combination of analog and digital devices can use higher voltage domains for analog devices to achieve improved linearity or operating voltage range. Level shifters are used to interface between the various voltage domains.

Geometric scaling of semiconductor technologies has resulted in an increased voltage difference between the voltage domains, making the design of the level shifters more challenging. For example, the higher voltages can damage the gate oxide of the transistor devices used in the low voltage domain. Furthermore, high-speed level shifting is required for many systems. High-speed shifting often requires large transistor devices, however the parasitic capacitance associated with large devices reduces the level shifting speed.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 5 is graphical view of a simulation of an input to a standard level shifter.

FIG. 6 is a graphical view of a simulation of an inverted input to a standard level shifter.

FIG. 7 is a graphical view of a simulation of a differential output of a standard level shifter.

DETAILED DESCRIPTION

Embodiments of systems and methods described herein provide for the shifting of voltage levels between a low voltage domain and a high voltage domain. The level shifting described herein results in reliable operation over a wide combination of voltage, fabrication process and temperature ranges (i.e. operating margin), with high speed, low input parasitic capacitance and no crowbar currents (e.g. direct current flow from the supply to ground after level shifting has occurred).

This improvement in performance is due, in part, to a novel approach to level shifting, which employs active feedback to accelerate a transition of output states. Furthermore, a minimal input stimulus (e.g. trigger) is amplified by a unique combination of devices to latch and amplify the stimulus while reducing competing currents associated, in part, with the previous output state. The reduction of competing currents is uniquely reduced at least through a combination of power gating, and through a reinforcing interaction between a pair of latches. The reduction of competing currents advantageously also eliminates crow bar currents, thus reducing overall system power consumption amongst other advantages. In addition, high voltage signals are separated from low voltage devices to maintain gate oxide integrity and accordingly provide for reliable operation.

Advantageously, the embodiments and concepts of this disclosure are applicable to a wide variety of applications, including but not limited to, networking, microcontrollers, communication and consumer electronics and automotive designs. The embodiments are described with a complementary metal oxide semiconductor (CMOS) technology, however other technologies are considered to be within the scope of this disclosure. For example, some embodiments will use Bipolar CMOS (BICMOS), while others will use Silicon On Insulator (SOI) technologies.

Figure 1:
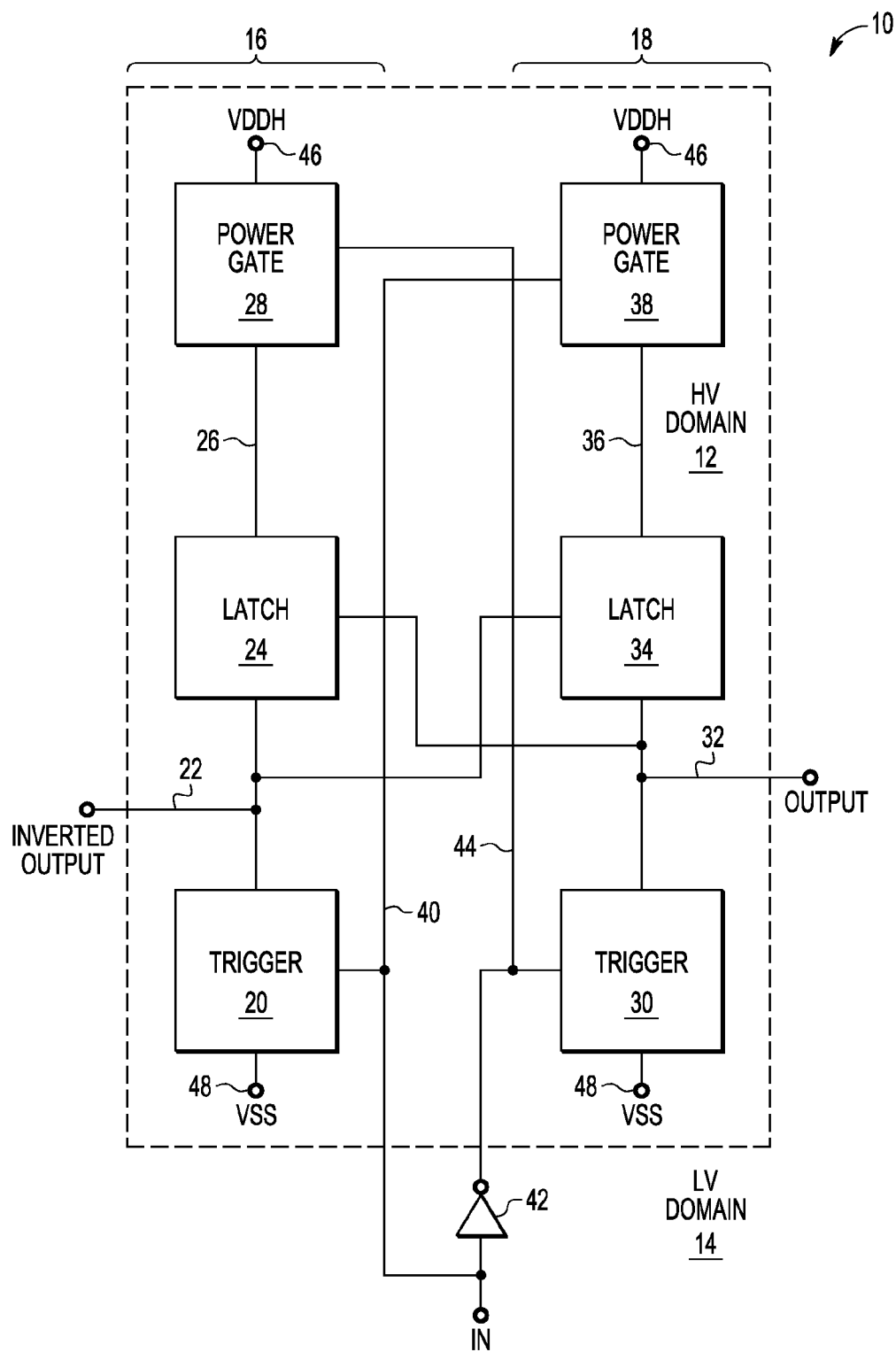
FIG. 1 is a schematic view of an embodiment of a level shifter with improved operation.

FIG. 1 shows an embodiment 10 of a level shifter, in accordance with the present disclosure, depicting the functional blocks used to convert a low voltage input to a high voltage output. In one example, the low voltage input is an address, data or control output from a microprocessor communicating with an analog function (e.g. a memory device or a transceiver). The level shifter is composed of devices in a high voltage (HV) domain 12. In one embodiment, the devices in the HV domain are HV transistors, characterized by at least one of a thicker gate oxide, a longer channel length, graded drains or other channel engineering to allow the HV transistors to tolerate high voltages.

The term "high voltage" includes voltages that are greater than, or equal to, a corresponding low voltage in a low voltage (LV) domain 14, the LV domain 14 being comprised primarily of devices that operate from an LV supply voltage. In one non-limiting example, the HV domain is nominally 3.3 Volts and the LV domain is nominally 1.1 Volts. It should be appreciated, that other voltage values and combinations are realized within the scope of this disclosure, wherein the HV domain operates at a voltage greater than or equal to the LV domain.

The term "coupled to" includes, but is not limited to, a direct low resistance connection between two or more elements, a capacitive coupling or an inductive coupling. For convenience, the terms used herein are provided to aid in the understanding of the description, and are in no way to be construed as limiting the scope of the invention.

The embodiment 10 of a level shifter includes a first branch 16 and a second branch 18. The first branch 16 includes a trigger 20 coupled to a latch 24. The latch 24 is coupled to a power gate 28. Similarly, the second branch 18 includes a trigger 30 coupled to a latch 34. The latch 34 is coupled to a power gate 38. Each branch operates between a high voltage supply (VDDH) 46 and a ground (VSS) 48. An LV input 40 is coupled to the trigger 20 of the first branch 16 and the power gate 38 of the second branch 18. An inverted low voltage input 44 is coupled to the trigger 30 of the second branch 18 and the power gate 28 of the first branch. The latch of the second branch 34 and the trigger of the second branch 30 are coupled to an output and the latch of the first branch 24. The latch of the first branch 24 and the trigger of the first branch 20 are coupled to an inverted output and the latch of the second branch 34.

In another embodiment, the level trigger comprises the elements and connections as described above, for the embodiment 10, with the addition of an inverter 42 in the low voltage domain 14 to provide the inverted low voltage input 44 from the low voltage input 40.

The term "partially activate" refers to the application of a control input (e.g. a gate voltage to an NFET or a PFET) to form a conduction channel between the drain and source terminals of the NFET or PFET, but with a conduction level less than that achieved with a larger control input equal to the maximum permissible control input level. For example, an NFET designed to operate in an HV domain of 3.3 Volts will "partially activate" with 1.1 Volts applied between the respective gate and source terminals, but will "activate" (e.g. fully activate") with 3.3 Volts applied between the respective gate and source terminals. The term "partially deactivate" refers to the application of a control input (e.g. a gate voltage to an NFET or a PFET) to disconnect or terminate a conduction channel between the drain and source terminals of the NFET or PFET, but a fully terminated conduction level is achieved with a larger control input equal to the maximum permissible control input level. For example, a PFET designed to operate in an HV domain of 3.3 Volts will "partially deactivate" with 1.1 Volts applied to the gate and 3.3 Volts applied to the source, but will "deactivate" (e.g. fully deactivate") with 3.3 Volts applied to both the gate and source terminals. For convenience, the terms used herein are provided to aid in the understanding of the description, and are in no way to be construed as limiting the scope of the invention.

Figure 2:
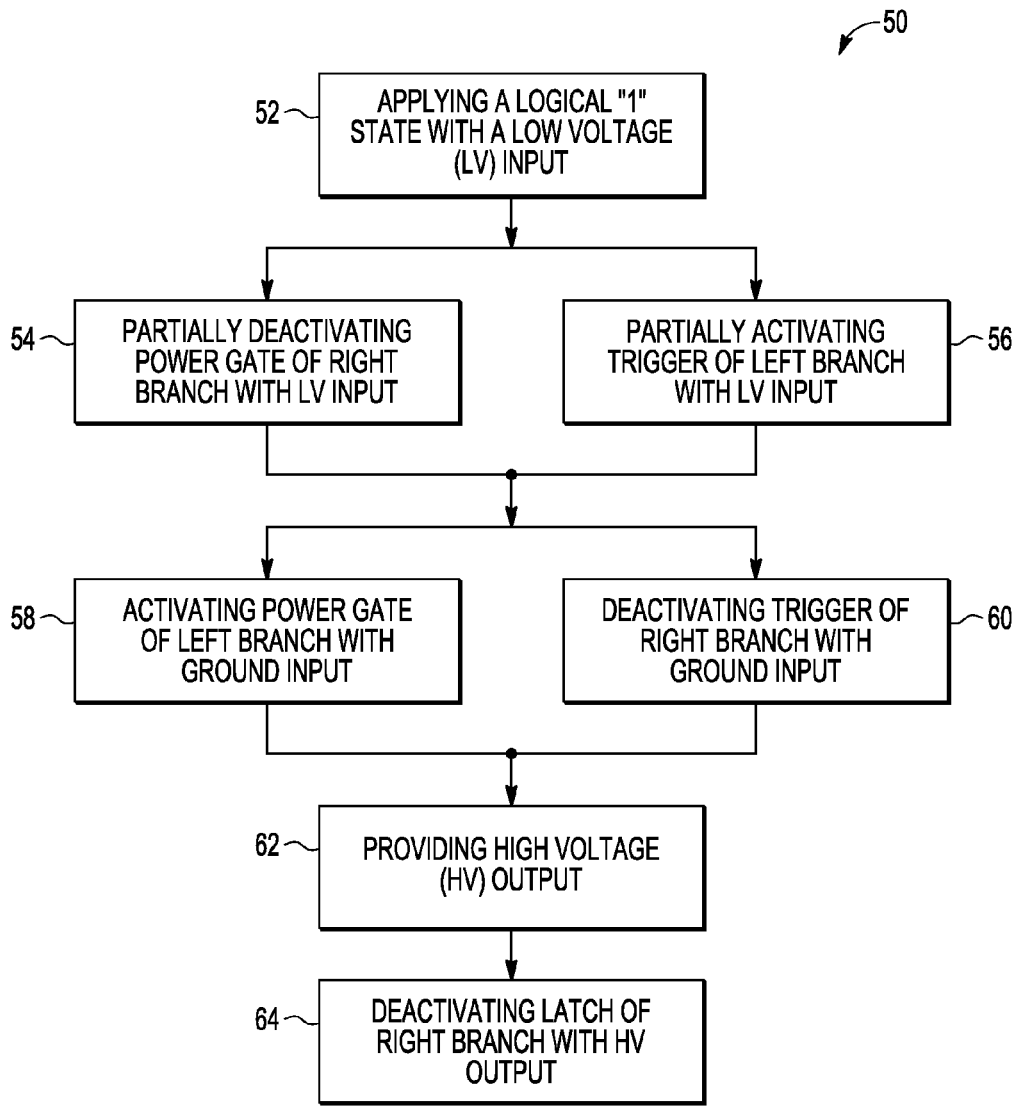
FIG. 2 is a flowchart representation of a method of level shifting with improved operation.

With reference to the level shifter shown in FIG. 1 and the level shifting method of FIG. 2 the operation of the level shifter will be further described for an embodiment with an HV supply nominally providing 3.3 Volts and an LV supply nominally providing 1.1 Volts. At step 52, a logical "1" state is applied to the level shifter with an LV input 40. For example, an input 40 is raised from 0 Volts to 1.1 Volts. At step 54, the power gate of the second branch 38 is partially deactivated with the LV input 40. For example, 1.1 Volts is applied to the power gate 38, which reduces the conductance of the power gate 38 relative to the application of 0 Volts but not sufficiently to reduce the conduction of the power gate 38 to an insignificant level (e.g. to a sub-threshold conduction level). At step 56, the trigger of the first branch 20 is partially activated with the LV input 40. For example, 1.1 Volts is applied to the trigger 20, which increases the conductance of the trigger 20 relative to the application of 0 Volts but not sufficiently to increase the conduction of the trigger 20 to a maximum value allowed by the design limits of the trigger 20 (e.g. 3.3 Volts in one example). In one embodiment, the steps 54 and 56 occur concurrently, although in another embodiment, one step precedes the other step due to the relative response time between the trigger 20 and the power gate 38.

At step 58, the power gate of the first branch 28 is activated with a ground input 44. At step 60, the trigger of the second branch 30 is deactivated with the ground input 44. In one embodiment, the steps 58 and 60 occur concurrently, although in another embodiment, one step precedes the other step due to the relative response time between the power gate 28 and the trigger 30. At step 62, an HV output 32 is provided. At step 64, the latch of the second branch 34 is deactivated with the HV output 32.

Figure 3:
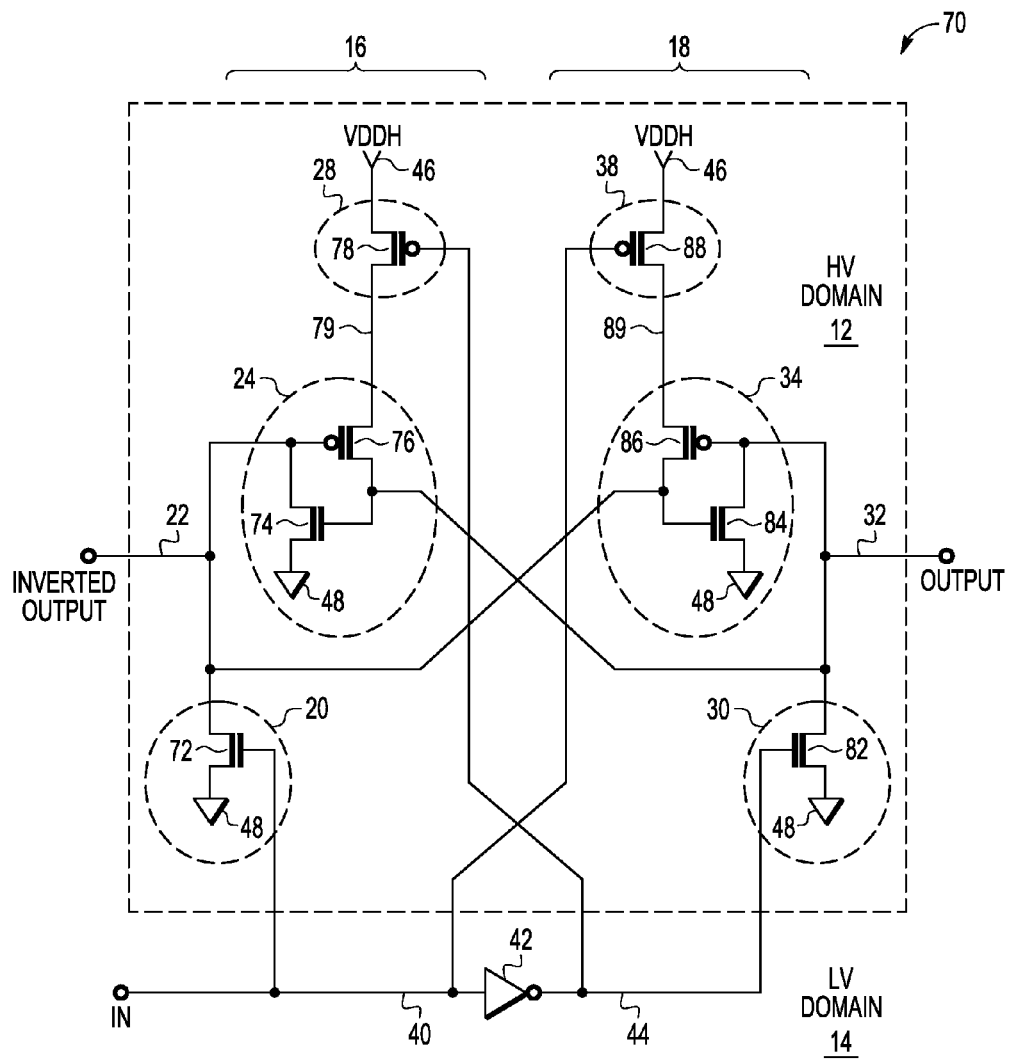
FIG. 3 is a schematic view of an embodiment of a level shifter with improved operation.

FIG. 3 shows an embodiment 70 of a level shifter depicting a device level implementation used to convert a low voltage input to a high voltage output. Referring to FIG. 1 and FIG. 3, the level shifter 70 includes an HV domain 12 with a first branch 16 and a second branch 18. An inverter 42 produces an inverted low voltage input 44 from a low voltage input 40. The first branch 16 includes a trigger 20, a latch 24 and a power gate 28. The second branch 18 includes a trigger 30, a latch 34 and a power gate 38. The trigger 20 initiates (e.g. triggers) a transition of the latch 24 from one bi-stable state to another bi-stable state when the low voltage input 40 transitions to a high state. Similarly, the trigger 30 initiates a transition of the latch 34 from one bi-stable state to another bi-stable state when the inverted low voltage input 44 transitions to a high state. Each of the power gates 28 and 38 enables or disables a respective conduction path between a high voltage supply (e.g. VDDH) 46 and ground (e.g. VSS) 48. In an alternative embodiment, the level shifter 70 also includes the inverter 42 operating in an LV domain 14.

In one embodiment, the trigger 20 includes a first NFET 72. The first NFET 72 has a gate connected to a low voltage input 40 and a source connected to a ground 48. A drain of the first NFET 72 is connected to an inverted output 22. The latch 24 includes a second NFET 74 and a first PFET 76. The gate of the second NFET 74 connects to the drain of the first PFET 76 and the gate of the first PFET 76 connects to the drain of the second NFET 74, thereby forming a regenerative latch. The gate of the first PFET 76 also connects to the inverted output 22. In one embodiment, the power gate 28 includes a second PFET 78. A gate of the second PFET 78 connects to an inverted low voltage input 44. A source of the second PFET 78 connects to the high voltage supply 46. A drain of the second PFET 78 connects to the source of the first PFET 76 of the latch 24.

In another embodiment, the trigger 30 includes a third NFET 82. The third NFET 82 has a gate connected to an inverted low voltage input 44 and a source connected to a ground 48. A drain of the third NFET 82 is connected to an output 32. The latch 34 includes a fourth NFET 84 and a third PFET 86. The gate of the fourth NFET 84 connects to the drain of the third PFET 86 and the gate of the third PFET 86 connects to the drain of the fourth NFET 84, thereby forming a regenerative latch. The gate of the third PFET 86 also connects to the output 32. In one embodiment, the power gate 38 includes a fourth PFET 88. A gate of the fourth PFET 88 connects to the low voltage input 40. A source of the fourth PFET 88 connects to the high voltage supply 46. A drain of the fourth PFET 88 connects to the source of the third PFET 86 of the latch 34.

With reference to FIG. 2 and FIG. 3, the level shifter 70 will now be described in an example embodiment with the HV domain operating at 3.3 Volts and the LV domain 14 operating at 1.1 Volts. It should be understood that other voltage values and combinations are envisioned with the scope of this disclosure, where the voltage of the HV domain is equal to or greater than the voltage of the LV domain. A transition from a logical "0" state to a logical "1" state begins with the low voltage input 40 at 0 Volts and the output 32 at 0 Volts. The low voltage input 40 is raised to 1.1 Volts and the inverted low voltage input 44 is thus lowered to 0 Volts. The low voltage input 40 partially activates the first NFET 72 in the trigger 20 of the first branch 16 and also partially deactivates the fourth PFET 88 in the power gate 38 of the second branch 18. The inverted low voltage 44 activates the second PFET 78 of the power gate 28 of the first branch 16 and deactivates the third NFET 82 of the trigger 30 of the second branch 18.

The output 32 is still close to 0 Volts from the initial logical "0" state, which deactivates the second NFET 74 of the latch 24 of the first branch 16 and activates the third PFET 86 of the latch 34 of the second branch 18. A conduction path is formed from the high voltage supply 46, through the partially deactivated fourth PFET 88, then through the activated third PFET 86 and then through the first NFET 72 to ground 48. The size of the first NFET 72 (e.g. the channel width) is designed to be large enough that the resulting voltage at the inverted output 22 and at the gate of the first PFET 76 is sufficiently low to be below the switching point of the latch 76. Specifically, when the inverted output 22 is below the switching point of the latch, the conduction through the second PFET 78 and through the first PFET 76 is sufficient to charge the gate of the second NFET 74 and thus partially activate the second NFET 74 to the point where the second NFET 74 further discharges the inverted output 22 and then fully activates the first PFET 76. This in turn, will fully activate the second NFET 74.

With the latch 24 fully activated, the conduction path from the high voltage supply 46, through the second PFET 78 and the first PFET 76 will charge the output 32 in competition with the fourth NFET 84 discharging the output 32. The fourth NFET 74 of the latch 24 discharges the inverted output 22 to 0 Volts, which deactivates the fourth NFET 84 of the latch 34, thus allowing the output 32 to rise to 3.3 Volts. As the output 32 reaches the HV voltage of 3.3 Volts, the third PFET 86 will also fully deactivate, thus breaking the conduction path from the high voltage supply 46, through the fourth PFET 88, the third PFET 86, and the first NFET 72 to ground 48. The first branch 16 and second branch 18 are symmetric structures, thus the operation of transitioning from a logical "1" state to a logical "0" state follows a similar sequence to that described for the transition from a logical "0" state to a logical "1" state with the devices for each branch transposed with the other branch. It should be clearly understood that one or more of the steps of the sequence described above for the transition from a logical "0" state to a logical "1" state can temporally overlap at least one or more of the remaining steps. The sequential flow thus described is intended for illustrative purposes and to aid in understanding the interaction of the transistors shown in FIG. 3.

Each of the regenerative latches 24 and 34 is cross-coupled to the second branch 18 and first branch 16 respectively providing for high-speed level shifting over a wide (fabrication) process, and (device) temperature range. Specifically, higher speed operation occurs for faster processes because the transistor devices have less channel resistance for a given voltage differential between the transistor gate and source terminals. Furthermore, higher speed operation can occur when a voltage difference between the low voltage supply and the high voltage supply is reduced, or when the low voltage supply is increased for a given high voltage supply level. This higher speed operation results, in part, from higher current conduction through the trigger 20, when the low voltage input 40 is high, (or conversely through the trigger 30, when the inverted low voltage input 44 is high). This higher current conduction through Trigger 20 or Trigger 30 results in a faster state transition of the latch 24 or 34 respectively.

The embodiment 70 has been described with example voltages of 1.1 Volts for the low voltage supply and 3.3 Volts for the high voltage supply. In another embodiment, the low voltage supply is 1.1 Volts and the high voltage supply is 2.5 Volts. In another embodiment, the low voltage supply is 0.9 Volts and the high voltage supply is 2.5 Volts. Various combinations of low voltage supply, high voltage supply and operating speeds are realizable with the embodiments described herein.

The capacitive load on the low voltage input 40 due to a gate oxide capacitance of the first NFET 72 and fourth PFET 88 is significantly reduced over prior implementations, as is the capacitive load on the inverted low voltage input 44 due to a gate oxide capacitance of the third NFET 82 and second PFET 78. These reductions in capacitive load are realized because of the reduction in transistor sizes (e.g. channel width times channel length) of the first NFET 72 and the third NFET 82, thereby allowing for a smaller, or compact level shifter 70. Accordingly the capacitive load on the circuitry driving the level shifter 70 is reduced resulting in faster system operation. The system includes the level shifter 70 with corresponding preceding circuitry in the signal chain. In one example, the system is an integrated circuit with a microcontroller with embedded memory, wherein data from the microcontroller is shifted by the level shifter 70 before the data communicates with the memory.

Embodiments described herein, eliminate the conduction path (e.g. "crowbar current") flowing from the HV supply 46 to the ground 48 after level shifting occurs. As described above, following the transition from a logical "0" state to a logical "1" state, (and similarly for a transition back to the logical "0" state), the conduction path from the high voltage supply 46 through the second PFET 78 and first PFET 76 is cut off from the ground 48 by deactivating the third NFET 82. The conduction path from the high voltage supply 46, through the partially deactivated fourth PFET 88 and activated first NFET 72 is cut off from the ground 48 by the deactivated third PFET 86. The elimination of crowbar current advantageously reduces total power consumption and improves reliability by reducing electromigration stress and thermal hot spots (e.g. localized heating on a semiconductor).

The embodiments of level shifters described herein further improve reliability by eliminating all sources of high voltage outputs driving low voltage transistors, hence preventing gate oxide damage of the low voltage transistors from electrical overstress.

Figure 4:
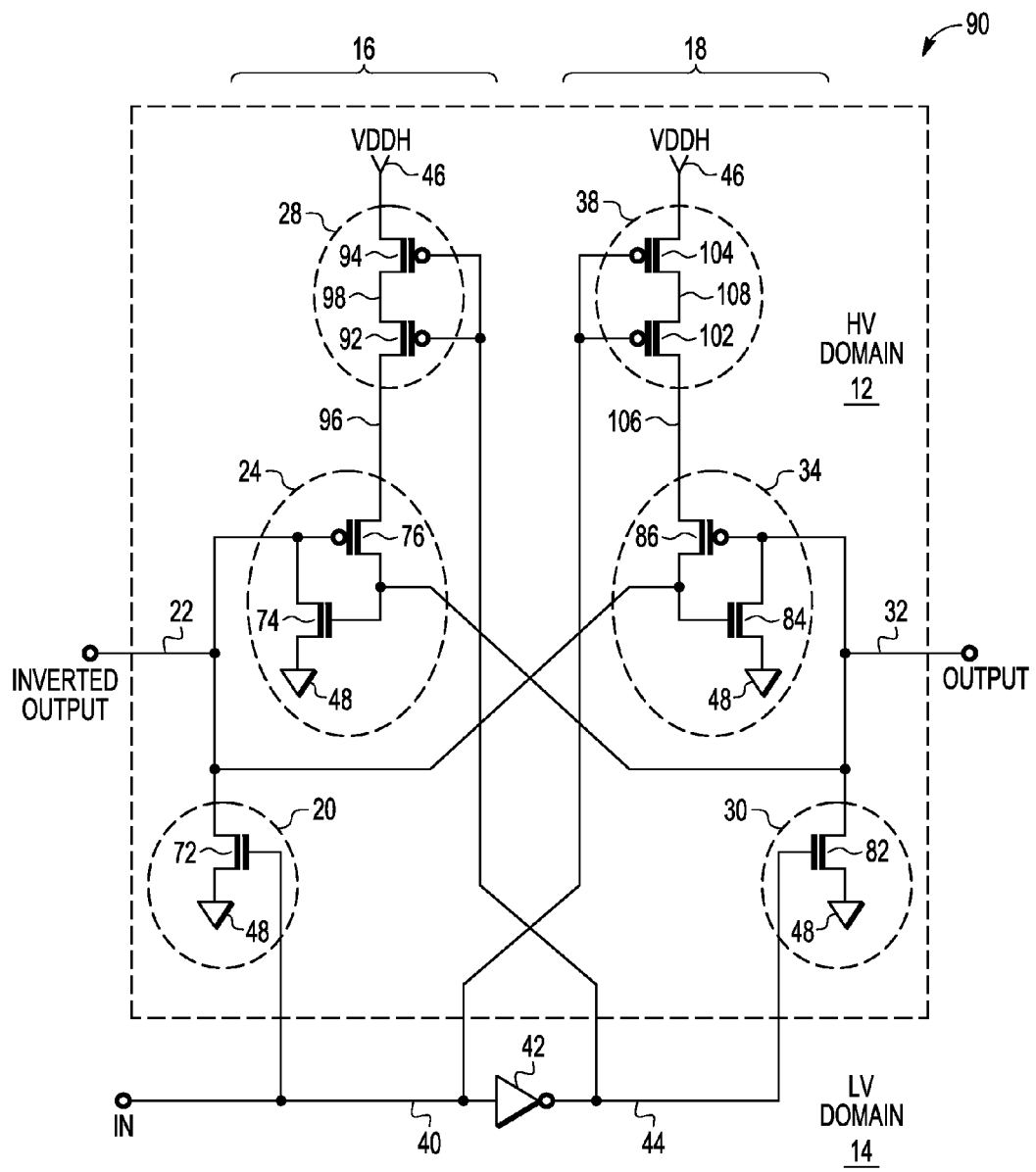
FIG. 4 is a schematic view of an embodiment of a level shifter with improved operation.

FIG. 4 shows an embodiment 90 of a level shifter, distinguished from the embodiment 70 of FIG. 3 by the implementation of the power gate 28 of the first branch 16 and the power gate 38 of the second branch 18. With reference to FIG. 4, the power gate 28 includes a fifth PFET 92 and a sixth PFET 94. A drain of the fifth PFET 92 is connected to the source of the first PFET 76 of the latch 24 of the first branch 16. A gate of the fifth PFET 92 is connected to the inverted low voltage input 44. A source of the fifth PFET 92 is connected to a drain 98 of the sixth PFET 94. A gate of the sixth PFET 94 is connected to the inverted low voltage input 44. A source of the sixth PFET 94 is connected to the high voltage supply 46. Similarly, the power gate 38 includes a seventh PFET 102 and an eight PFET 104. A drain of the seventh PFET 102 is connected to the source of the third PFET 86 of the latch 34 of the second branch 18. A gate of the seventh PFET 102 is connected to the low voltage input 40. A source of the seventh PFET 102 is connected to a drain 108 of the eighth PFET 104. A gate of the eighth PFET 104 is connected to the low voltage input 40. A source of the eighth PFET 104 is connected to the high voltage supply 46.

Replacing the single PFET used in each of the power gates of embodiment 70 with two PFETs connected in series, reduces the peak voltage drop across the channel (e.g. the voltage between the source and drain) of each PFET used in each power gate, and consequently improves the reliability of each PFET. The channel length of each PFET 78 and 88 in the embodiment 70 of FIG. 3 is twice the length of the channel length of each of the PFETs used in the power gates of the embodiment 90 of FIG. 4, thus maintaining substantially the same channel impedance when partially activated. For example, during the transition from a logical "0" state to a logical "1" state, the first NFET 72 will sink substantially the same current for both embodiments 70 and 90.

A further advantage of the power gates 28 and 38 as shown in FIG. 4 is that the PFETs 92, 94, 102 and 104 are designed to have minimum channel lengths limited by the photolithographic limits of the semiconductor technology being used for the particular embodiment, thus further reducing the area of the level shifter. In the embodiment 90 of FIG. 4, each NFET and each PFET in the high voltage domain 12 has the same channel length of 0.72 microns, thus improving fabrication process uniformity and resulting yield. In one embodiment, each PFET 76, 92, 94, 86, 102 and 104 has a channel length of substantially 0.72 microns and a channel width of substantially 0.78 microns, the NFET 74 and 84 has a channel length of substantially 0.72 microns and a channel width of substantially 1.00 microns, and each NFET 72 and 82 has a channel length of substantially 0.72 microns and a channel width of substantially 30 microns. The terms "channel length" and "channel width" described herein refer to the drawn dimensions used for mask fabrication and are not necessarily equivalent to the final dimensions after mask generation or semiconductor fabrication. In another embodiment, the bulk connection of at least one NFET is connected to its respective source terminal. In another embodiment, the bulk connection of at least one PFET is connected to its respective source terminal. The term "bulk connection" refers to a connection shared by one or more transistors that provides a transistor channel bias. For example, in one twin-well CMOS process, the bulk of an NFET is a P-Well biased to ground, and the bulk of a PFET is an N-Well biased to the high voltage supply.

Simulated performance of a standard level shifter is shown in FIG. 5, FIG. 6 and FIG. 7, and subsequently compared to the simulated performance of a level shifter with improved operation shown in FIG. 8, FIG. 9 and FIG. 10. The simulations of FIG. 5, FIG. 6, FIG. 7, FIG. 8, FIG. 9 and FIG. 10 are performed at 50 MHz assuming a junction temperature (e.g. the average temperature of the transistors) of −40 degree Celcius, worst case processing for each NFET, best case processing for the PFET, a low voltage supply of 0.99 Volts (e.g. 10% below the nominal value of 1.1 Volts), and a high voltage supply of 3.6 Volts (e.g. 10% above the nominal value of 3.3 Volts).

FIG. 5 shows an input waveform 110 with alternating rising edges 112 and falling edges 114. FIG. 6 shows an inverted input waveform 120, formed by inverting the input waveform 110. The inverted input waveform 120 has falling edges 122 and rising edges 124 resulting from the rising edges 112 and falling edges 114 of the input waveform 110 respectively. With reference to FIG. 7, when the input waveform 110 transitions from a logical "0" state to a logical "1" state and stays at state "1" for approximately 10 nanoseconds, the inverted output 132 tends towards 0 Volts and the output 134 tends towards 3.6 Volts. However, neither the inverted output 132 nor the output 134 are able to switch to opposing values before the falling edge 114 of the input waveform 110 because the standard level shifter is too slow.

Figure 8:
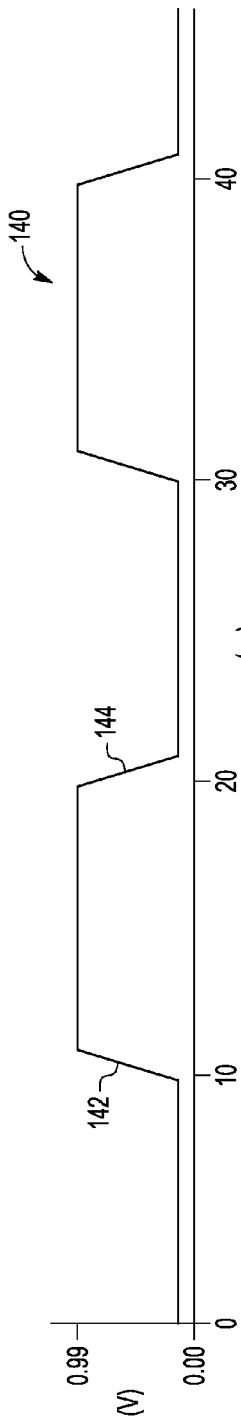
FIG. 8 is a graphical view of a simulation of an input to a level shifter with improved operation.
Figure 9:
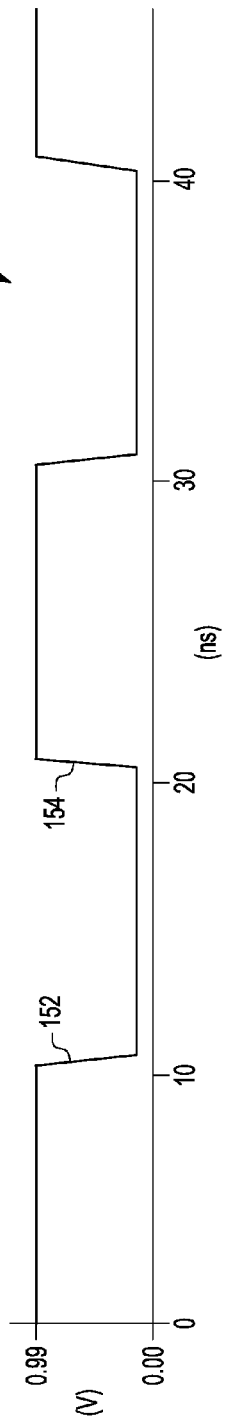
FIG. 9 is a graphical view of a simulation of an inverted input to a level shifter with improved operation.

FIG. 8 shows an input waveform 140 with alternating rising edges 142 and falling edges 144. FIG. 9 shows an inverted input waveform 150, formed by inverting the input waveform 140. The inverted input waveform 150 has falling edges 152 and rising edges 154 resulting from the rising edges 142 and falling edges 144 of the input waveform 140 respectively. With reference to FIG. 10, when the input waveform 140 transitions from a logical "0" state to a logical "1" state and stays at state "1" for approximately 10 nanoseconds, the inverted output 162 tends towards 0 Volts and the output 164 tends towards 3.6 Volts. In contrast to FIG. 7, the inverted output 162 and the output 164 quickly switch to opposing values in approximately 5 nanoseconds.

Figure 10:
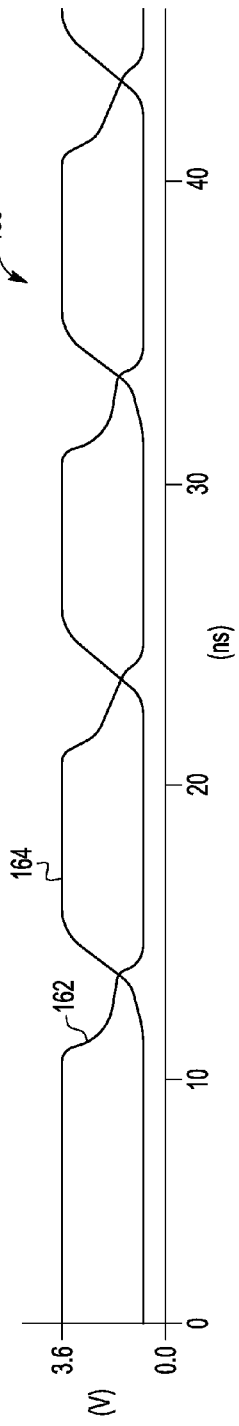
FIG. 10 is a graphical view of a simulation of a differential output of a level shifter with improved operation.

The comparative response shown in FIG. 7 and FIG. 10 shows a significant reduction in transition time between alternating states of the level shifter of the present disclosure over a standard (e.g. unimproved) level shifter. An improved response time of a level shifter enables higher speed operation of systems that employ such level shifters. In addition, the response of FIG. 7 shows a failure for the output to transition to a new state due to a combination of inadequate dwell time between the falling edge 122 and rising edge 124, and an inadequate operating margin (e.g. an ability to properly operate over a wide range of process, voltage and temperature values).

As will be appreciated, embodiments as disclosed include at least the following. In one embodiment, a level shifter includes a first branch and a second branch. A trigger of the first branch is coupled to a low voltage input, an inverted high voltage output and a ground. The trigger of the first branch is configured to change a voltage of the inverted high voltage output in response to the low voltage input. A latch of the first branch is coupled to the inverted high voltage output and a high voltage output. The latch of the first branch is configured to change a state of the high voltage output in response to the inverted high voltage output. A power gate of the first branch is coupled to an inverted low voltage input, the latch of the first branch and a high voltage supply. The power gate of the first branch is configured to enable a first current flowing from the high voltage supply through the latch of the first branch, in response to the inverted low voltage input. A trigger of the second branch is coupled to the inverted low voltage input, the high voltage output and the ground. The trigger of the second branch is configured to disable the first current from flowing to the ground in response to the inverted low voltage input. A latch of the second branch is coupled to the high voltage output and the inverted high voltage output. The latch of the second branch is configured to enable the change of the state of the high voltage output in response to the inverted high voltage output. A power gate of the second branch is coupled to the low voltage input, the latch of the second branch and the high voltage supply. The power gate of the second branch is configured to reduce a value of a second current flowing from the high voltage supply through the latch of the second branch, in response to the low voltage input.

Alternative embodiments of the level shifter include one of the following features, or any combination thereof. The low voltage input is nominally 1.1 Volts and the high voltage supply is nominally 3.3 Volts. At least one of the trigger of the first branch and the trigger of the second branch includes an N-channel Field Effect Transistor (NFET). At least one of the latch of the first branch and the latch of the second branch includes an NFET and a P-channel Field Effect Transistor (PFET), a drain of the NFET coupled to a gate of the PFET, and a drain of the PFET coupled to a gate of the NFET. At least one of the power gate of the first branch and the power gate of the second branch includes a first PFET and a second PFET, a drain of the first PFET coupled to a source of the second PFET, and a gate of the first PFET coupled to a gate of the second PFET. At least one of the power gate of the first branch and the power gate of the second branch includes a PFET. The trigger of the first branch is configured to receive the low voltage input to initiate an activation of the latch of the first branch.

In another embodiment, a method of level shifting includes partially deactivating a power gate of a second branch with a low voltage input and partially activating a trigger of a first branch with the low voltage input, whereby an impedance of the trigger of the first branch is lowered to activate a latch of the first branch. A power gate of the first branch is activated with a ground input and a trigger of the second branch is deactivated with the ground input. A high voltage output is provided from the power gate of the first branch conducting through the latch of the first branch. A latch of the second branch is deactivated with the high voltage output.

Alternative embodiments of the method of level shifting include one of the following features, or any combination thereof. The method further includes providing the ground input by inverting the low voltage input. The method further includes deactivating a latch of the second branch with the latch of the first branch. Activating the latch of the first branch includes partially activating a P-channel Field Effect transistor (PFET) with the trigger of the first branch, the PFET activating an N-channel Field Effect transistor (NFET) and the NFET activating the PFET. Deactivating a latch of the second branch includes deactivating a PFET of the latch of the second branch with the high voltage output. Deactivating a latch of the second branch includes deactivating an NFET of the latch of the second branch with an NFET of the latch of the first branch. Partially activating the trigger of the first branch further includes sinking current through an NFET of the trigger of the first branch, the current sourced by the power gate of the second branch conducting through a PFET of a latch of the second branch.

In another embodiment, a level shifter includes a gate of a first N-channel Field Effect Transistor (NFET) connected to a low voltage input, a drain of the first NFET connected to an inverted output. A drain of a first P-channel Field Effect Transistor (PFET) is connected to a gate of a second NFET and an output, and a drain of the second NFET is connected to a gate of the first PFET and the inverted output. A gate of a second PFET is connected to an inverted low voltage input, a source of the second PFET is connected to a high voltage supply, and a drain of the second PFET is connected to a source of the first PFET. A gate of a third NFET is connected to the inverted low voltage input, and a drain of the third NFET is connected to the output. A drain of a third PFET is connected to a gate of a fourth NFET and the inverted output, and a drain of the fourth NFET is connected to a gate of the third PFET and the output. A gate of a fourth PFET is connected to the low voltage input, a source of the fourth PFET is connected to the high voltage supply, and a drain of the fourth PFET is connected to a source of the third PFET.

Alternative embodiments of the level shifter include one of the following features, or any combination thereof. The first NFET is configured to activate the latch of the left branch when the trigger of the left branch is activated. The second PFET includes a fifth PFET and a sixth PFET, a drain of the fifth PFET is connected to the source of the first PFET, a gate of the fifth PFET is connected to the inverted low voltage input, a source of the fifth PFET is connected to a drain of the sixth PFET, a gate of the sixth PFET is connected to the inverted low voltage input and a source of the sixth PFET is connected to the high voltage supply. The fourth PFET includes a seventh PFET and an eighth PFET, a drain of the seventh PFET is connected to the source of the third PFET, a gate of the seventh PFET is connected to the low voltage input, a source of the seventh PFET is connected to a drain of the eighth PFET, a gate of the eighth PFET is connected to the low voltage input and a source of the eighth PFET is connected to the high voltage supply. A channel width of the first NFET is at least 30 microns, and a channel length of the first NFET is substantially 0.72 microns. A bulk connection of each NFET is connected to a respective source of each NFET and a bulk connection of each PFET is connected to a respective source of each PFET.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A level shifter comprising:
   a first branch and a second branch;
   a trigger of the first branch coupled to a low voltage input, an inverted high voltage output and a ground, the trigger of the first branch configured to change a voltage of the inverted high voltage output in response to the low voltage input;
   a latch of the first branch coupled to the inverted high voltage output and a high voltage output, the latch of the first branch configured to change a state of the high voltage output in response to the inverted high voltage output;
   a power gate of the first branch coupled to an inverted low voltage input, the latch of the first branch and a high voltage supply, the power gate of the first branch configured to enable a first current flowing from the high voltage supply through the latch of the first branch, in response to the inverted low voltage input;
   a trigger of the second branch coupled to the inverted low voltage input, the high voltage output and the ground, the trigger of the second branch configured to disable the first current from flowing to the ground in response to the inverted low voltage input;
   a latch of the second branch coupled to the high voltage output and the inverted high voltage output, the latch of the second branch configured to enable the change of the state of the high voltage output in response to the inverted high voltage output; and
   a power gate of the second branch coupled to the low voltage input, the latch of the second branch and the high voltage supply, the power gate of the second branch configured to reduce a value of a second current flowing from the high voltage supply through the latch of the second branch, in response to the low voltage input.

2. The level shifter of claim 1 wherein the low voltage input is nominally 1.1 Volts and the high voltage supply is nominally 3.3 Volts.

3. The level shifter of claim 1 wherein at least one of the trigger of the first branch and the trigger of the second branch comprises an N-channel Field Effect Transistor (NFET).

4. The level shifter of claim 1 wherein at least one of the latch of the first branch and the latch of the second branch comprises an NFET and a P-channel Field Effect Transistor (PFET), a drain of the NFET coupled to a gate of the PFET, and a drain of the PFET coupled to a gate of the NFET.

5. The level shifter of claim 1 wherein at least one of the power gate of the first branch and the power gate of the second branch comprises a first PFET and a second PFET, a drain of the first PFET coupled to a source of the second PFET, and a gate of the first PFET coupled to a gate of the second PFET.

6. The level shifter of claim 1 wherein at least one of the power gate of the first branch and the power gate of the second branch comprises a PFET.

7. The level shifter of claim 1 wherein the trigger of the first branch is configured to receive the low voltage input to initiate an activation of the latch of the first branch.

8. A method of level shifting comprising:
partially deactivating a power gate of a second branch with a low voltage input and partially activating a trigger of a first branch with the low voltage input, whereby an impedance of the trigger of the first branch is lowered to activate a latch of the first branch;
activating a power gate of the first branch and deactivating a trigger of the second branch;
providing a high voltage output from the power gate of the first branch conducting through the latch of the first branch; and
deactivating a latch of the second branch with the high voltage output.

9. The method of claim 8 further comprising applying a logical one state to the low voltage input.

10. The method of claim 8 further comprising deactivating the latch of the second branch with the latch of the first branch.

11. The method of claim 8 wherein activating the latch of the first branch comprises partially activating a P-channel Field Effect Transistor (PFET) with the trigger of the first branch, the PFET activating an N-channel Field Effect Transistor (NFET) and the NFET activating the PFET.

12. The method of claim 8 wherein deactivating the latch of the second branch comprises deactivating a PFET of the latch of the second branch with the high voltage output.

13. The method of claim 8 wherein deactivating the latch of the second branch comprises deactivating an NFET of the latch of the second branch with an NFET of the latch of the first branch.

14. The method of claim 8 wherein partially activating the trigger of the first branch further comprises sinking current through an NFET of the trigger of the first branch, the current sourced by the power gate of the second branch conducting through a PFET of the latch of the second branch.

15. A level shifter comprising:
a gate of a first N-channel Field Effect Transistor (NFET) connected to a low voltage input, and a drain of the first NFET connected to an inverted output;
a drain of a first P-channel Field Effect Transistor (PFET) connected to a gate of a second NFET and an output, and a drain of the second NFET connected to a gate of the first PFET and the inverted output;
a gate of a second PFET connected to an inverted low voltage input, a source of the second PFET connected to a high voltage supply, and a drain of the second PFET connected to a source of the first PFET;
a gate of a third NFET connected to the inverted low voltage input, and a drain of the third NFET connected to the output;
a drain of a third PFET connected to a gate of a fourth NFET and the inverted output, and a drain of the fourth NFET connected to a gate of the third PFET and the output; and
a gate of a fourth PFET connected to the low voltage input, a source of the fourth PFET connected to the high voltage supply, and a drain of the fourth PFET connected to a source of the third PFET.

16. The level shifter of claim 15 wherein the first NFET is configured to activate a latch including the first PFET and the second NFET, when the first NFET is partially activated.

17. The level shifter of claim 15 wherein the second PFET is comprised of a fifth PFET and a sixth PFET, a drain of the fifth PFET is connected to the source of the first PFET, a gate of the fifth PFET is connected to the inverted low voltage input, a source of the fifth PFET is connected to a drain of the sixth PFET, a gate of the sixth PFET is connected to the inverted low voltage input and a source of the sixth PFET is connected to the high voltage supply.

18. The level shifter of claim 15 wherein the fourth PFET is comprised of a seventh PFET and an eighth PFET, a drain of the seventh PFET is connected to the source of the third PFET, a gate of the seventh PFET is connected to the low voltage input, a source of the seventh PFET is connected to a drain of the eighth PFET, a gate of the eighth PFET is connected to the low voltage input and a source of the eighth PFET is connected to the high voltage supply.

19. The level shifter of claim 15 wherein a channel width of the first NFET is at least 30 microns, and a channel length of the first NFET is substantially 0.72 microns.

20. The level shifter of claim 15 wherein a bulk connection of each NFET is connected to a respective source of each NFET and a bulk connection of each PFET is connected to a respective source of each PFET.

* * * * *